United States Patent [19]

Whitehead et al.

[11] Patent Number: 5,124,633
[45] Date of Patent: Jun. 23, 1992

[54] DUAL SIDED PRINTED CIRCUIT BOARD TEST SYSTEM

[75] Inventors: Robert E. Whitehead, Irving; Evan J. Evans, Alvord; Stephen J. Foster, Garland, all of Tex.

[73] Assignee: Electronic Packaging Co., Dallas, Tex.

[21] Appl. No.: 639,821

[22] Filed: Jan. 10, 1991

[51] Int. Cl.$^5$ ............................................ G01R 31/02
[52] U.S. Cl. .............................. 324/73.1; 324/158 F; 324/537
[58] Field of Search ................... 324/158 F, 73.1, 537, 324/539, 158 R; 371/25.1

[56] References Cited

U.S. PATENT DOCUMENTS

| | | | |
|---|---|---|---|
| 3,970,934 | 7/1976 | Aksu | 324/158 F |
| 4,417,204 | 11/1983 | Dehmel et al. | 371/25.1 |
| 4,598,246 | 7/1986 | Staples et al. | 324/158 F |
| 4,707,657 | 11/1987 | Boegh-Petersen | 324/158 F |
| 4,769,596 | 9/1988 | Faucett | 324/158 F |

Primary Examiner—Ernest F. Karlsen
Attorney, Agent, or Firm—Ross, Howison, Clapp & Korn

[57] ABSTRACT

A system for reducing the number of points to be tested on a dual sided printed circuit board. The circuit board includes a top and a bottom surface and a plurality of network traces extending across both sides of the printed circuit board. Each network trace includes end points. The system provides for identifying the end points of a network trace extending on both sides of the printed circuit board. The mid-point along the network trace which is common to both sides of the printed circuit board is identified. Structure is provided for independently testing each side of the printed circuit board between one end point and the mid-point on the top surface of the printed circuit board and between the mid-point and the second end point on the bottom surface of the printed circuit board.

4 Claims, 9 Drawing Sheets

DUAL SIDED PRINTED CIRCUIT BOARD TEST SYSTEM

TECHNICAL FIELD OF THE INVENTION

This invention relates to systems for testing printed circuit boards, and more particularly to a system for testing dual sided printed circuit boards.

BACKGROUND OF THE INVENTION

Automatic test systems for testing printed circuit boards utilize a multitude of points on the printed circuit board to which are applied various stimulus signals. Simultaneously with the application of these stimulus signals, other points on the printed circuit board are monitored for a response to the stimulus signals. By analyzing the results of the responses, it can be determined which points on the printed circuit board are connected to each other and which points are isolated. By comparing this data to the data of a reference, known good printed circuit board, or design data used to create the printed circuit board, it can be determined if the board was properly manufactured.

Typical printed circuit board test systems include large numbers of programmable signal drivers for producing the various stimulation signals to be applied to the printed circuit board under test. These systems further include a large number of programmable signal receivers for receiving the signals produced by the printed circuit board under test in response to the stimulus signals. Due to the rapid advances in surface mount technology and multi-layer fabrication techniques, many of the circuit boards require large numbers of test points or points located on the circuit board with minimal spacing such that these printed circuit boards exceed the capabilities of present automatic test systems.

Due to the greater densities and the use of surface mount technology on both sides of printed circuit boards, it has become necessary to test both sides of printed circuit boards to determine whether the board was correctly manufactured. Using present technology, in order to test both sides of a printed circuit board, a top and bottom fixture is utilized. The top fixture includes test probes that interface with the test points on the printed circuit board top surface. These test probes are interconnected to interface probes that will mate with probes on the bottom fixture which are in turn connected to an automatic test system. Therefore, for each point on the top surface of a printed circuit board that requires testing, three test probes and an interconnection are required. Top and bottom test fixturing is much more expensive than single sided testing and in low quantity production printed circuit board runs, this cost can be prohibitive.

A need has thus arisen for a printed circuit board test system to reduce the number of test points required to test a circuit board and wherein each side of a printed circuit board can be separately tested from a single sided test fixture to ensure that a complete and accurate test of a printed circuit board is achieved while reducing cost considerations.

SUMMARY OF THE INVENTION

In accordance with the present invention, a system for reducing the number of points to be tested on a dual sided printed circuit board is provided. The circuit board includes a top and a bottom surface and a plurality of network traces extending across both sides of the printed circuit board. Each network trace includes end points. The system provides for identifying the end points of a network trace extending on both sides of the printed circuit board. The mid-point along the network trace which is common to both sides of the printed circuit board is identified. Structure is provided for independently testing each side of the printed circuit board between one end point and the mid-point on the top surface of the printed circuit board and between the mid-point and the second end point on the bottom surface of the printed circuit board.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1A:
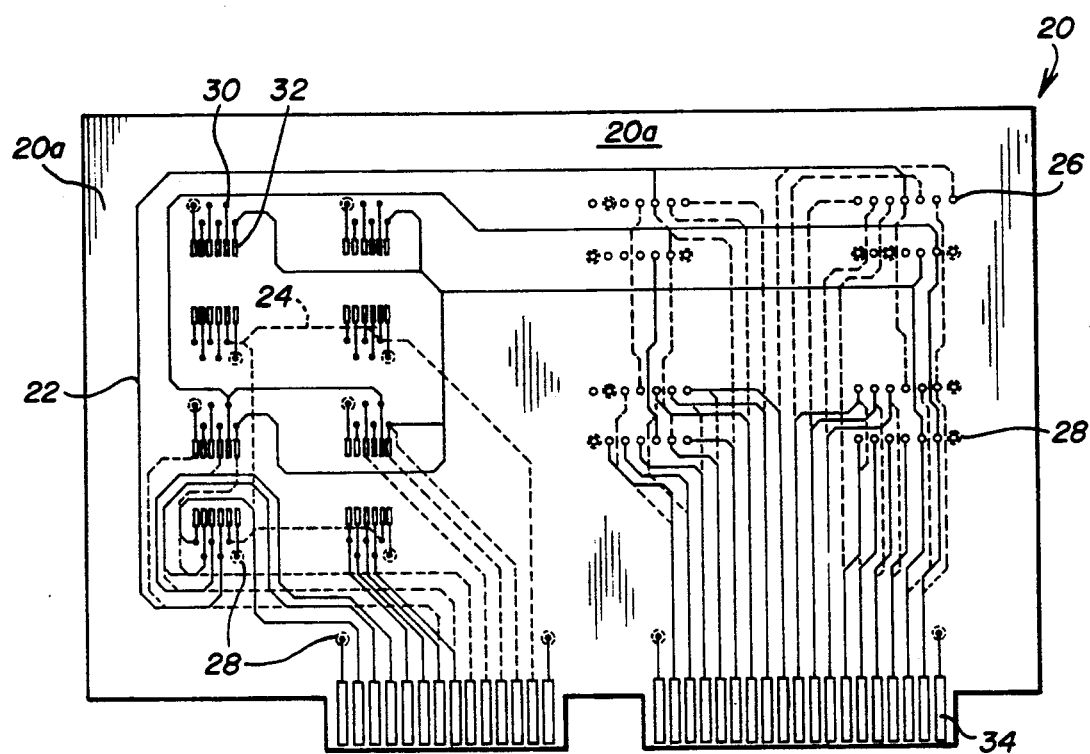
FIGS. 1a and 1b illustrate a top plan view and bottom plan view, respectively, of a printed circuit board including network traces.
Figure 1B:
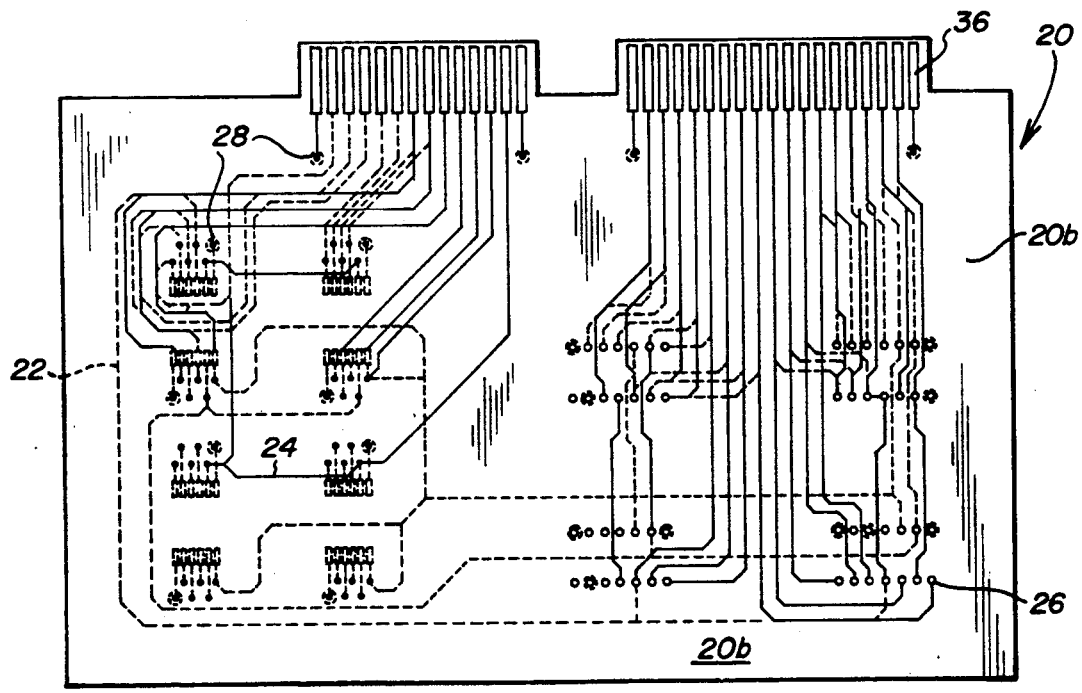

Referring simultaneously to FIGS. 1a and 1b, a typical printed circuit board is illustrated and is generally identified by the numeral 20. Printed circuit board 20 comprises a board based material of non-conductive material such as for example, Fiberglass or plastic. Printed circuit board 20 includes a top surface 20a or a component side of printed circuit board 20 and a bottom surface 20b or a circuit side of printed circuit board 20. Top surface 20a of printed circuit board 20 includes network traces 22, and bottom surface 20b includes network traces 24. Printed circuit board 20 includes through hole mounting holes 26, through holes 28 and 30 which are used to transfer network traces from one layer of printed circuit board 20 to the other layer, surface mount component mounting pads 32 and surface mount edge fingers 34 and 36 used to interface the completed printed circuit board to a host device.

The present system utilizes computer aided design data for generating the network traces and paths of printed circuit board 20 to analyze and determine the structure of printed circuit board 20. The system then analyzes the circuitry to determine the individual network traces 22 and 24.

Figure 2A:
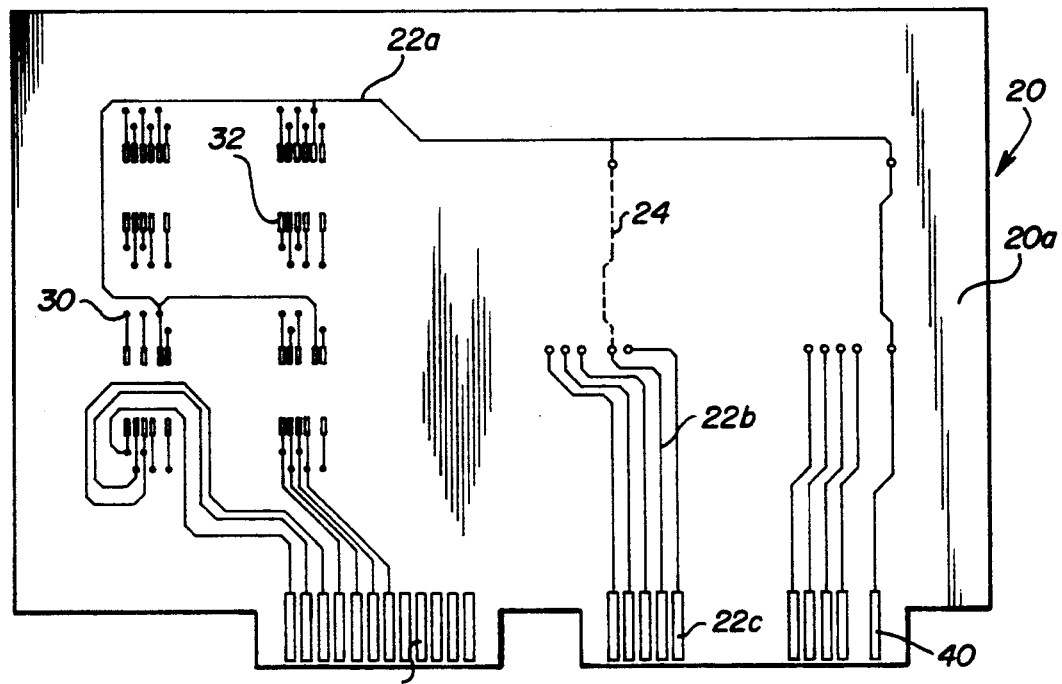
FIGS. 2a and 2b illustrate the top plan view and bottom plan view, respectively, of the printed circuit board of FIG. 1 illustrating the network traces that can be tested in their entirety from one side of the printed circuit board.
Figure 2B:
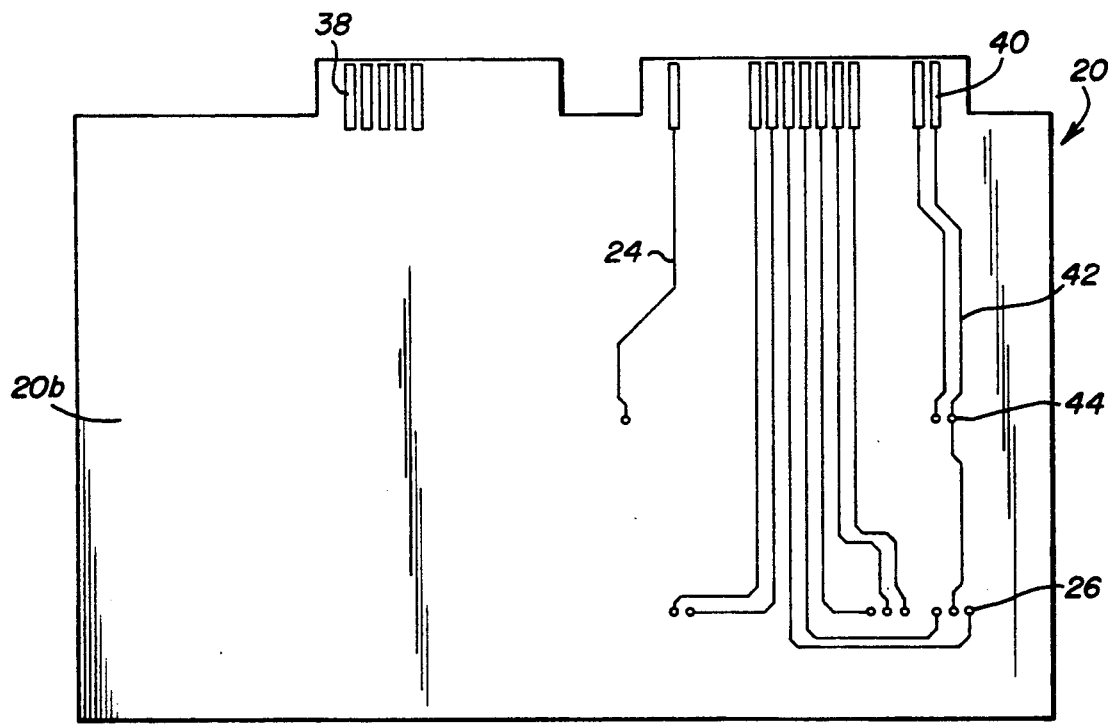

Referring to FIGS. 2a and 2b, the present system analyzes each network trace to determine the end points of the network trace that are to be tested. The network traces that can be tested in their entirety from a single side of printed circuit board 20 are isolated. Top surface 20a of printed circuit board 20 includes a network trace 22a that interconnects with a network trace 24 on bottom surface 20b of printed circuit board 20 and which returns at network trace 22b on top surface 20a of printed circuit board 20 before reaching an end point at 22c. Surface mount device mounting pad 32 and through hole 30 can be tested with a single test probe to the surface mount pad on top surface 20a of printed circuit board 20 as these items have no other network traces connected to them and have only the one end point that must be tested to ensure that these points are not shorted to any other network trace.

Printed circuit board 20 includes surface mount edge finger connectors 38 which are tested with a single probe to ensure that these connectors are not shorted. Surface mount edge fingers 40 are part of network traces that must be tested for both shorts to other network traces and also tested for continuity with the other end points of these networks. As illustrated in FIG. 2b, network trace 42 is a network trace that can be tested in its entirety from bottom surface 20b of printed circuit board 20 by probing the surface mount edge finger 40 and the component mounting through hole 26 at the opposite end of network trace 42. Located along network trace 42 is a component mounting through hole 44 that is a mid-point of network trace 42 and need not be probed to obtain a complete test of the network trace 42.

Figure 3A:
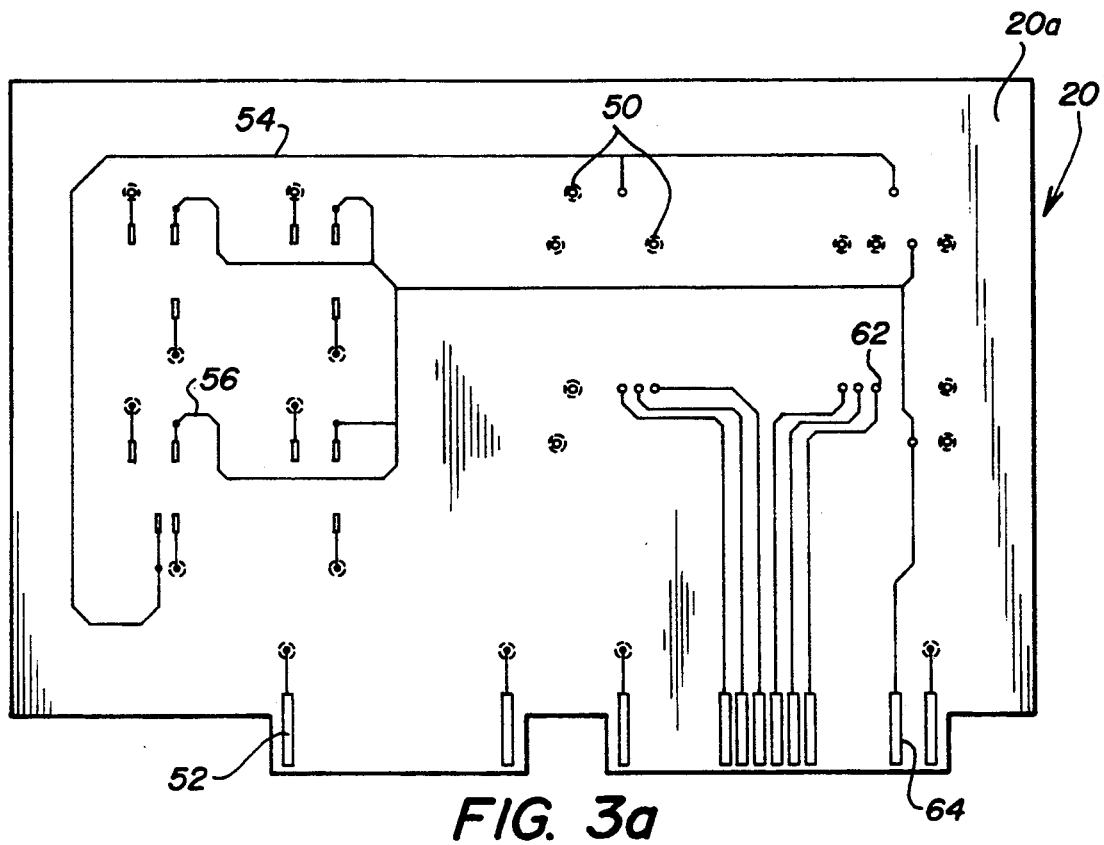
FIGS. 3a and 3b illustrate the top plan view and bottom plan view, respectively, of the printed circuit board of FIG. 1 illustrating the network traces that can be tested in their entirely by testing part of the network on one side of the printed circuit board and part of the network on the other side of the printed circuit board.
Figure 3B:
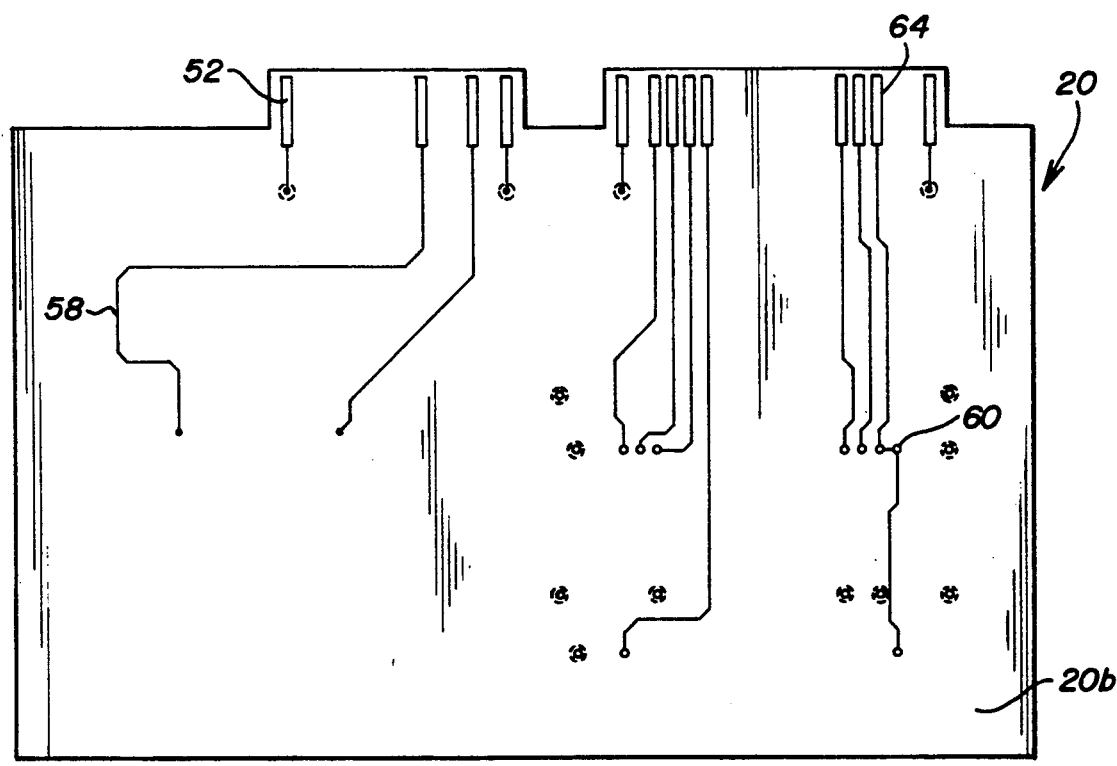

Referring now to FIGS. 3a and 3b, the present system processes network traces that must be tested from both sides 20a and 20b of printed circuit board 20. Component mounting through holes 50 interconnect internal power and ground networks that must be tested for continuity and shorts by probing these points in conjunction with surface mount edge fingers 52 and all of the surface mount device mounting pads that are connected to power and ground networks. Networks 54, 56, and 58 are networks that must be tested by probing all of the end points on each side of printed circuit board 20 and by selecting a common component mounting through hole, 60 and 62. Through holes 60 and 62 represent a mid-point of the network trace. The present invention ensures that all of the end points of a network trace on the top surface of a printed circuit board have continuity to the common component mounting through hole while the same component mounting through hole has continuity to all of the network trace end points on the bottom surface of the printed circuit board. Edge fingers 64 are probed in conjunction with a common component mounting through hole mid-point for a complete test of these networks.

Figure 4A:
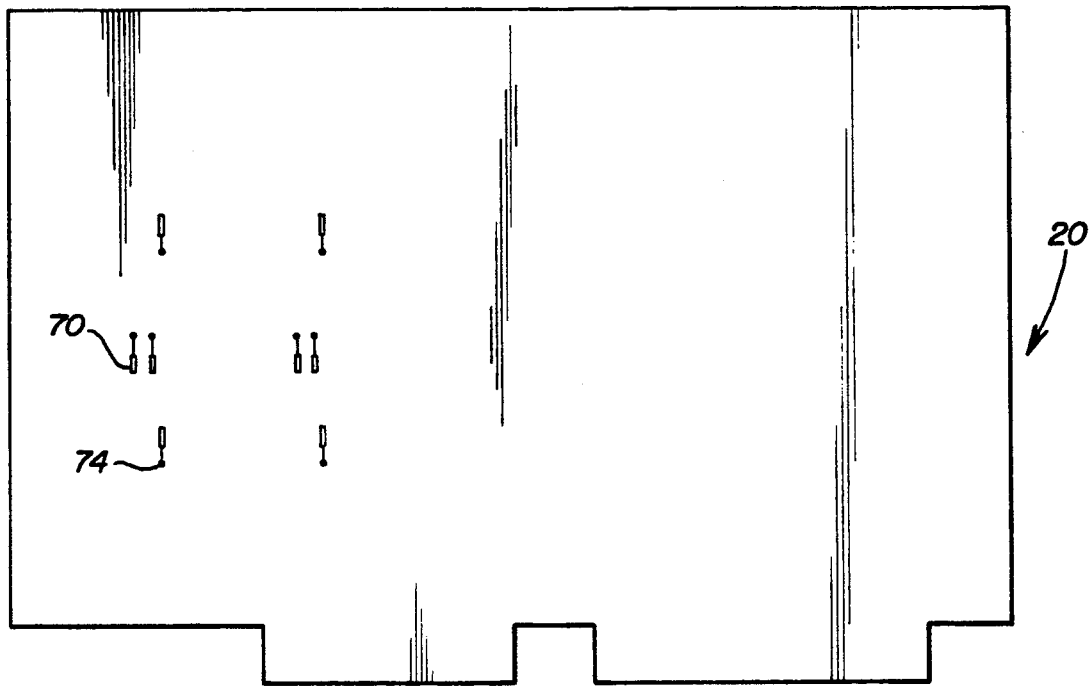
FIGS. 4a and 4b illustrate the top plan view and bottom plan view, respectively, of the printed circuit board shown in FIG. 1 illustrating the network traces that can be tested for shorts to other network traces by testing part of the network on one side of the printed circuit board and part of the network on the other side of the printed circuit board.
Figure 4B:
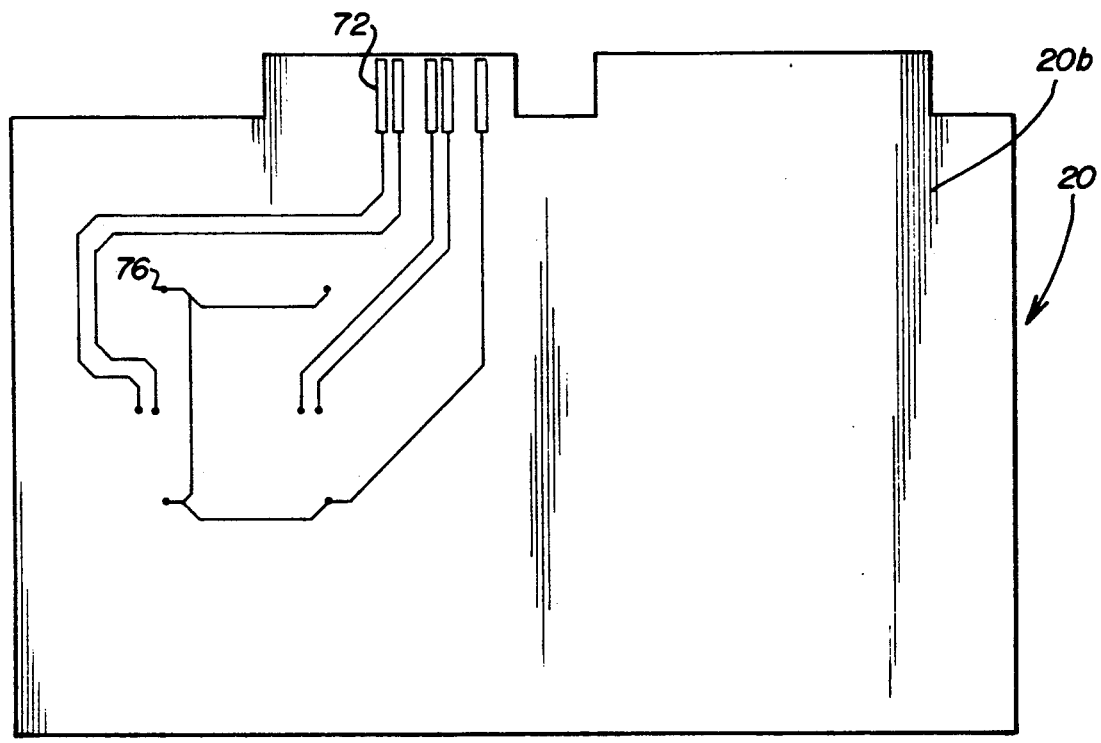

Referring now to FIG. 4, some network traces on printed circuit board 20 run between surface mount component mounting pads and surface mount edge fingers on one surface of printed circuit board 20 to surface mount component mounting pads and surface mount edge fingers on the other surface of printed circuit board 20 and do not connect to any component mounting through holes that could be tested. These networks can only be tested for shorts and incomplete continuity. The end points of these network traces are saved in a memory file to be displayed in a manual continuity test following automatic testing. Surface mount device mounting pads 70 interconnect to surface mount edge fingers 72 using through holes 74 and 76 to transfer trace networks from one layer to another layer and cannot be tested. All of these surface mount pads and edge fingers must be probed, and test points on the side with the fewest probes are saved in a file to be used for manual testing.

Figure 5A:
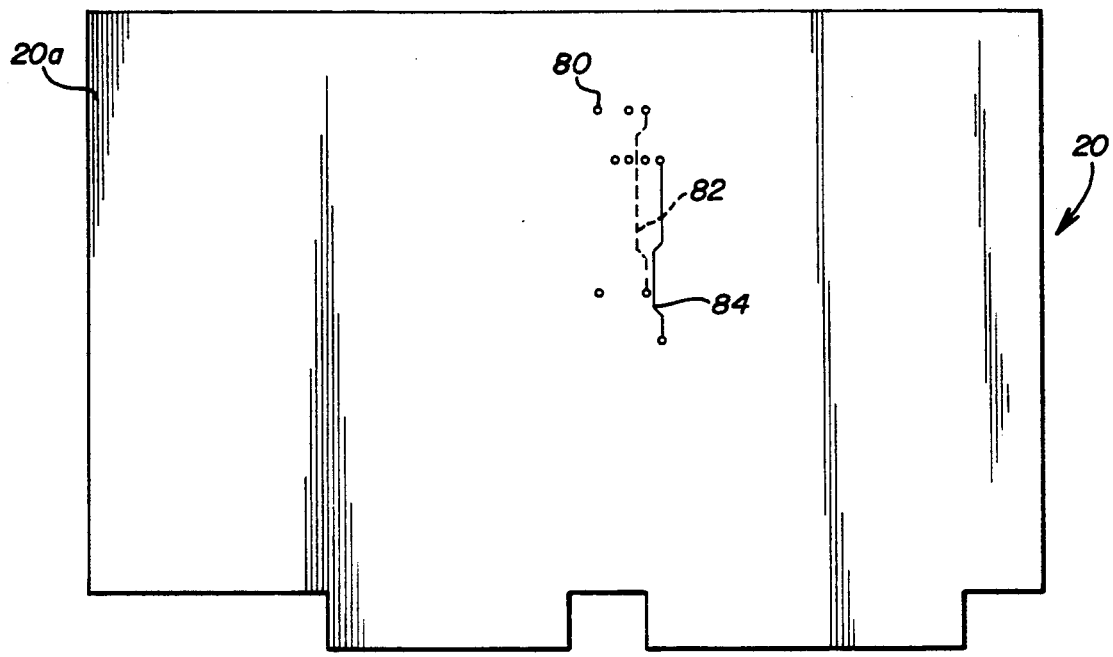
FIGS. 5a and 5b illustrate the top plan view and bottom plan view, respectively, of the printed circuit board of FIG. 1 illustrating the network traces that can be tested in their entirety from either side of the printed circuit board.
Figure 5B:
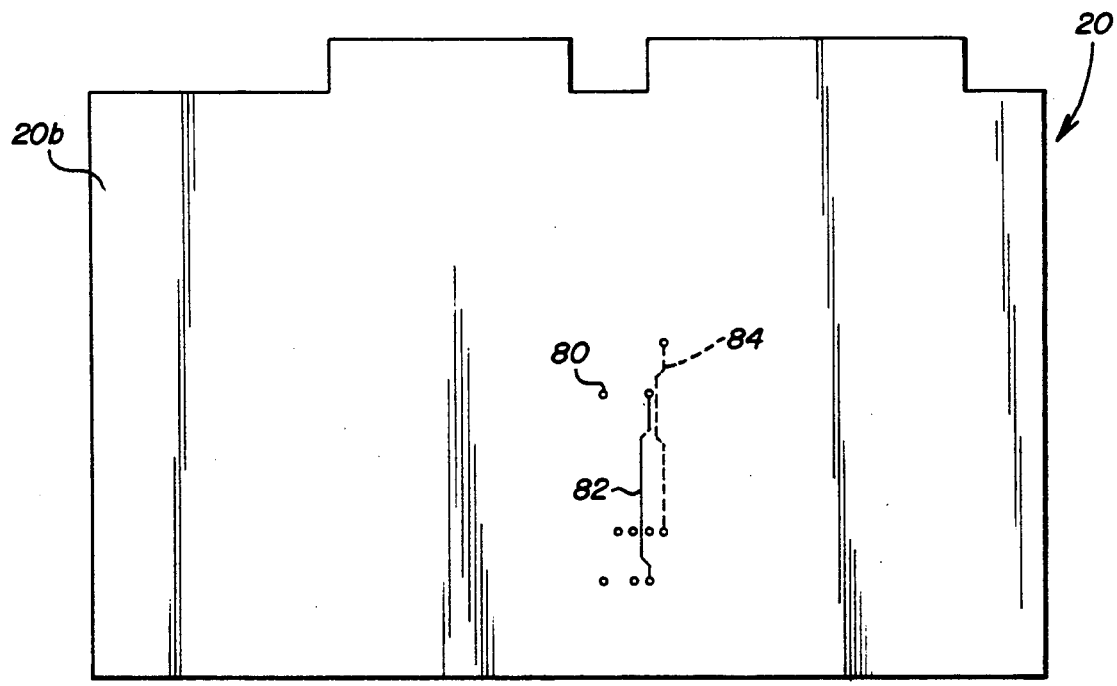

Referring to FIGS. 5a and 5b, the final group of network traces to be tested are the networks that have no surface mount pads or edge fingers and all of the end points are component mounting through holes. Unused component mounting through holes 80 are not connected to any network trace but must be tested for shorts. Network trace 82 is a network on surface 20b of printed circuit board 20, and network trace 84 is a network trace on surface 20a of printed circuit board 20. Network traces 82 and 84 end in component mounting through holes and have no surface mounting pads, therefore these network traces can be tested from either side of the circuit board 20. The system of the present invention examines the data for the test probes of the other networks on printed circuit board 20 and places the test probes for this last group of networks on the side of printed circuit board 20 with the fewest probes.

Figure 6:
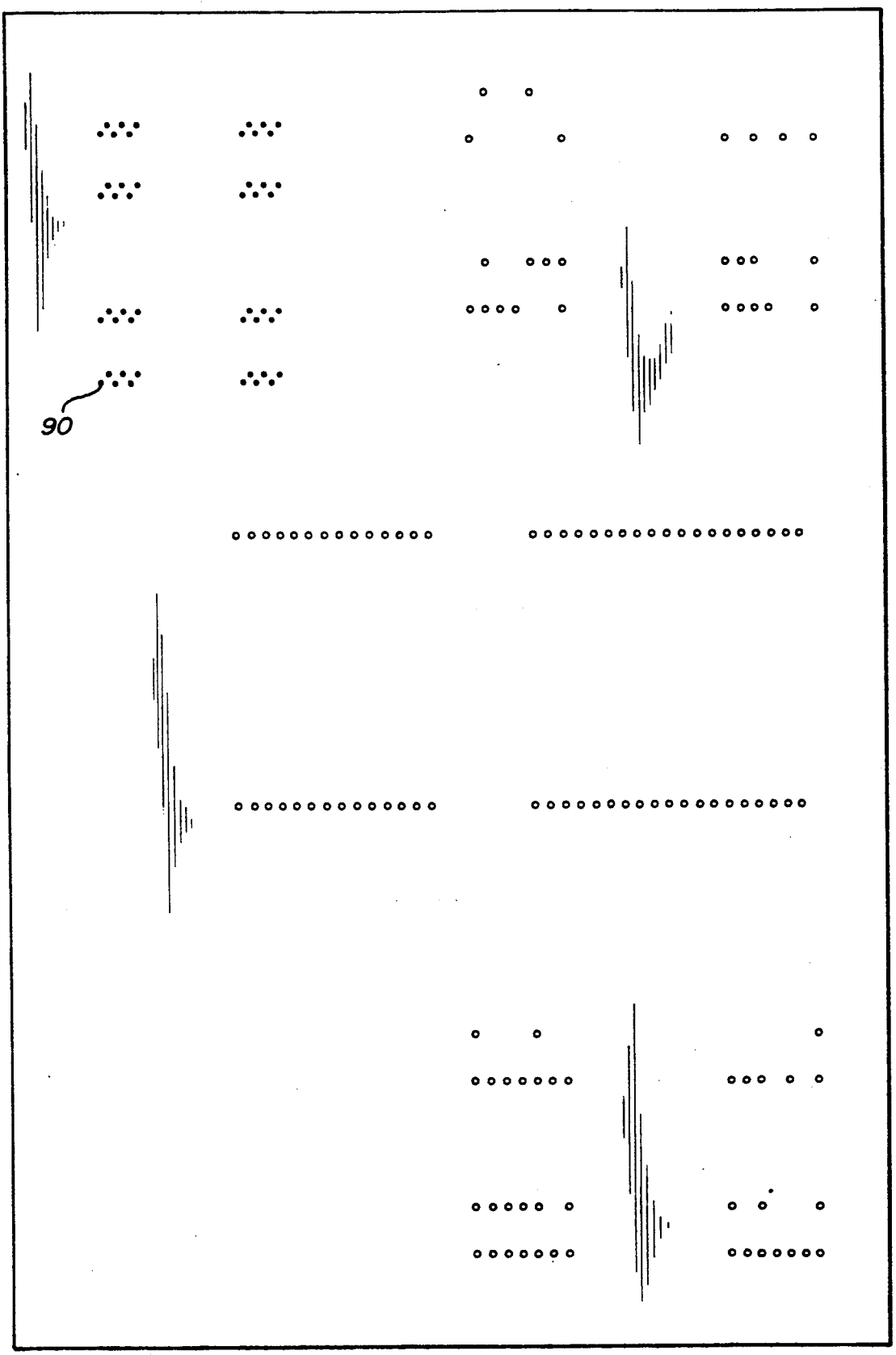
FIG. 6 illustrates the test points of a fixture for testing the printed circuit board illustrated in FIG. 1.

FIG. 6 illustrates a map of a test fixture showing all of the test probes 90 that are required to test printed circuit board 20. A test fixture as shown in FIG. 6 can be utilized to test two printed circuit boards 20 simultaneously with top surface 20a and bottom surface 20b being tested for two different printed circuit boards simultaneously.

Figure 7:
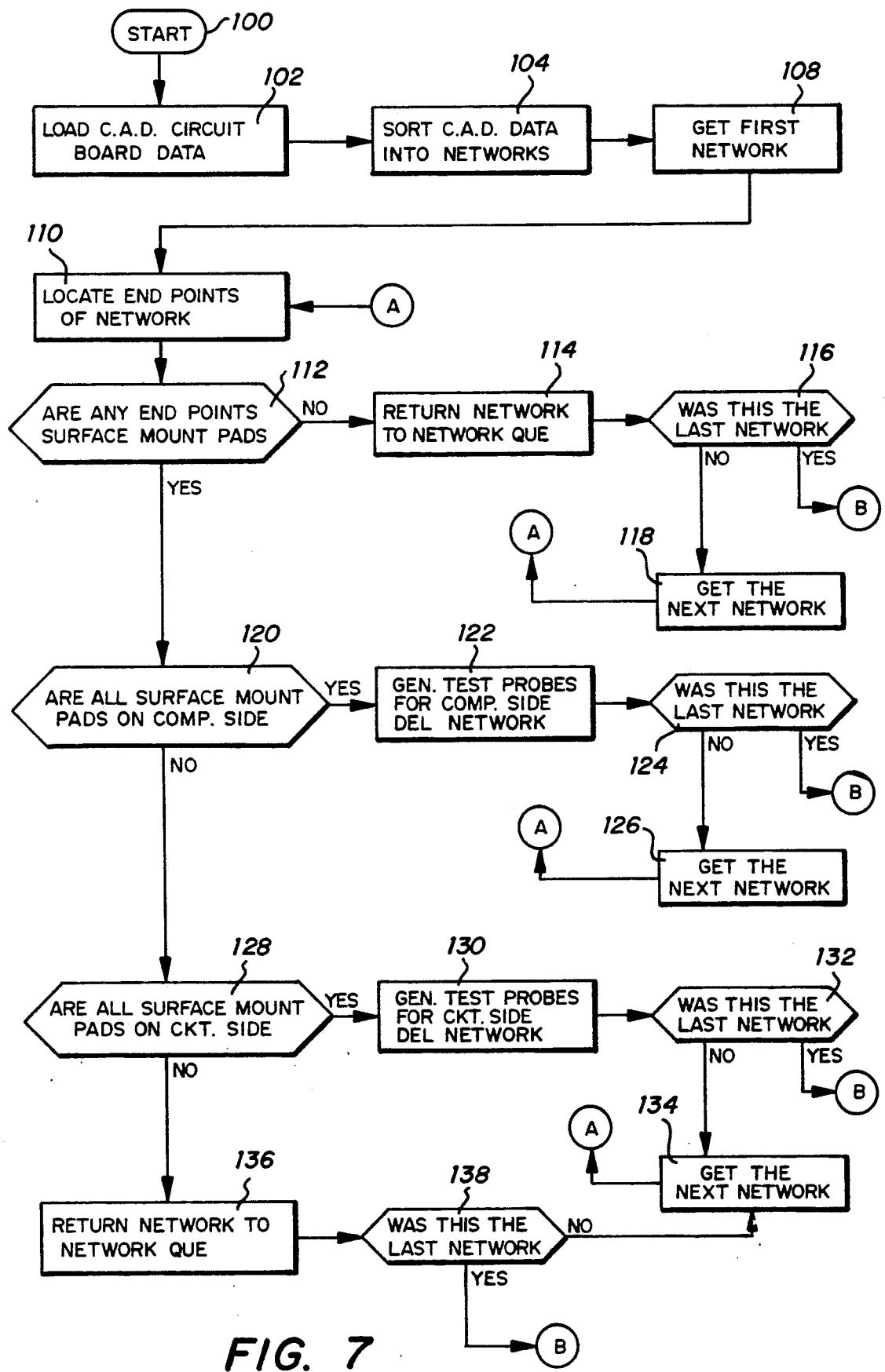
FIGS. 7-9 are computer flow diagrams illustrating the computer software functions performed by the present system.
Figure 8:
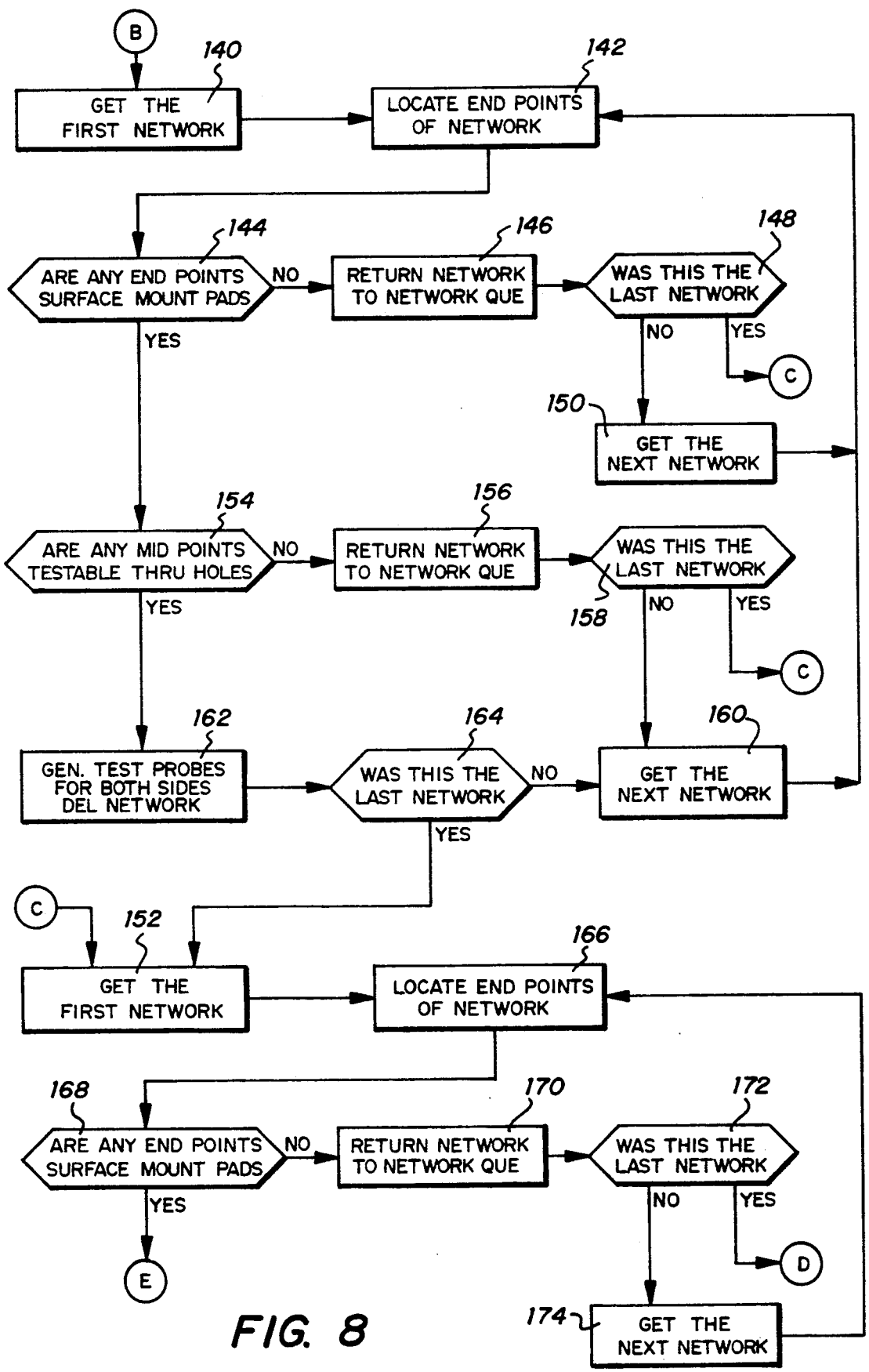
Figure 9:
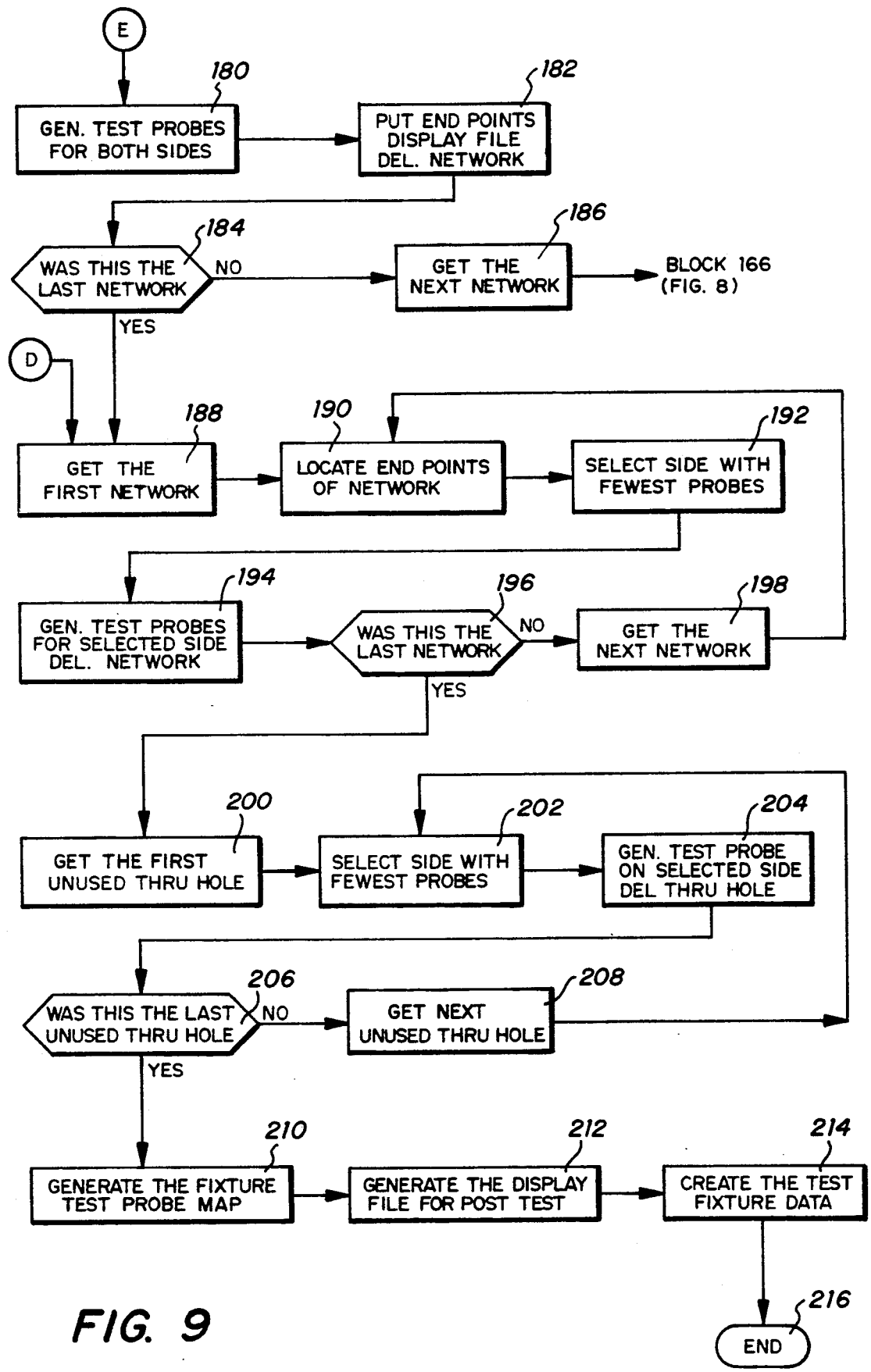

Referring now to FIGS. 7-9, a computer software flow diagram is provided for outlining the steps of the software of the present system for testing dual sided printed circuit boards. Referring to FIG. 7, the program commences at block 100 and the computer aided design data for a printed circuit board is loaded into the system at block 102. The computer aided design data is sorted into separate networks and the identification of through holes that can be tested and an identification of the layers containing surface mount pads 20 is performed at block 104. The first network is selected at block 108 and the end points of the first network are located at block 110. A determination is then made as block 112 to determine if the network end points are surface mount pads. If the determination was no, the system returns to the computer aided design data file at blocks 114 and 116. If there are additional network traces to be processed, the next network is obtained at block 118 and the flow diagram returns to block 110. If the last network was processed, the flow diagram continues to FIG. 8.

If the decision at block 112 was yes, a decision is made at block 120 to determine if the surface mount pads are all on the component side of printed circuit board 20. If the decision is yes, the test probes are generated at block 122 and the selected network is deleted from the network data file. A decision is then made at block 124 to determine if this was the last network to be tested. If the decision is no, the next network is obtained from the data file at block 126 and the computer flow diagram returns to block 110. If the decision is yes, the flow diagram continues with FIG. 8.

If the decision at decision block 120 was no, a decision is made at block 128 to determine if all of the surface mount pads are on the circuit side of the printed circuit board 20. If the decision is yes, the test probes are generated at block 130 and the network trace is deleted from the network data file. A decision is then made at block 132 to determine if this was the last network trace tested. If the decision is no, the next network is obtained at block 134 and the flow diagram continues to block 110. If the decision was yes, the flow diagram continues to FIG. 8.

If the decision at block 128 was no, meaning that the surface mount pads are on both sides of the printed circuit board 20, then the flow diagram continues at block 136 to the network queue and a determination is made at block 138 to determine whether this was the last network analyzed. If the decision is no, the next network is obtained at block 134. If the decision is yes, the flow diagram continues to FIG. 8. After the last network has been processed, all of the test points for circuits with surface mount pads that can be tested from one side of the printed circuit board have been generated and the program continues through the computer aided design circuit data to determine networks that can be tested from both sides of the printed circuit board.

Referring now to FIG. 8, the first network is obtained at block 140 and the end points of the network are located at block 142. A determination is made at block 144 to determine if any of the end points of the selected network are surface mount pads. If there are no surface mount pads, the network is returned to the network file at block 146 and a determination is made at block 148 to determine if this was the last network processed. If the decision is no, the next network is obtained at block 150 and the program returns to block 142. If the decision was yes, the program continues to block 152 (FIG. 8).

If the decision at block 144 was yes, a determination is made at block 154 to determine if the surface mount pads are testable through holes. If the decision is no, the network is returned to the network data file at block 156. A decision is then made at block 158 as to whether this was the last network tested. If the decision is no, the next network is obtained at block 160 and the program returns to block 142. If the decision is yes, the program continues to block 152.

If the decision at block 154 was yes, the test probes are generated at block 162. A decision is then made at block 164 to determine if this was the last network to be processed. If the decision is no, the next network is obtained at block 160. If the decision was yes, the process continues to block 152 in order to check the networks for surface mount pads that must be checked for continuity as a post processing test. The first network is obtained at block 152 and the end points are located at block 166. A decision is then made at block 168 to determine if any of the end points are surface mount pads. If the decision is yes, the program continues to FIG. 9. If the decision is no, the network is returned to the network file at block 170. A determination is then made at block 172 to determine if this was the last network to be processed. If the decision is no, the next network is obtained at block 174. If the decision was yes, the program continues to FIG. 9.

Referring now to FIG. 9, if the surface mount pads are present at the end points of a network, the test probes are generated at block 180 and a display file is created that will be sued in post testing for continuity at block 182. The next network is obtained and a decision is made at block 184 to determine if this was the last network. If the decision is no, the next network is obtained at block 186 and the program continues back to block 166 (FIG. 8).

If the decision at block 184 was yes, indicating that the networks have only testable through holes, the first network is obtained at block 188 and the end points of the network are located at block 190. At block 192, the fixture data is examined to determine which said of the printed circuit board has the fewest test points. The test probes are generated at block 194 and the network is deleted form the data file. A decision is then made at block 196 to determine if this was the last network processed, if the decision is no, the next network is obtained at block 198 and the program continues to block 190.

If the decision at block 196 was yes, the first unused through hole is obtained at block 100. The fixture data is examined at block 202 to determined which side of the printed circuit board 20 has the fewest test points. The test probe data is then generated at block 204 of the unused pads on the particular side of the fixture. The unused pad data is then deleted from the file. A decision is then made at block 206 as to whether this deleted data represented the last unused through hole. If the decision was no, the next unused through hole data is obtained at block 208 and the program continues back to block 202. If the decision at block 206 was yes, representing the networks, traces and unused pads have bee processed, the program generates the test fixture data at block 210. The post continuity test display data is provided at block 212, and the test fixture data is unloaded at block 214 to complete the process at block 216.

It therefore can be seen that the present invention reduces the number of points to be tested on dual sided printed circuit boards by analyzing circuit network traces and pads to determine continuity between top and bottom surfaces of a printed circuit board. The network traces are sorted into five groups, the first group of which can be tested in their entirety from the top surface of the printed circuit board. The second group of network traces are those than can be tested in their entirety from the bottom surface of the printed circuit board. The third group of network traces are those networks that can be tested completely by selecting a common mid-point in the network trace and testing part of the network trace by probing the end points on the top side and the mid-point and testing the remainder of the network trace by probing end point on the bottom surface of the printed circuit board and the same mid-point that was previously tested. The fourth group of network traces are those network traces that have end points on both surfaces of the printed circuit board and which interconnect via a through hole which is covered and cannot be tested except for manual testing. The final group of network traces are those that include end point through holes that can be tested from either side of the printed circuit board. The present system allows for generating fixture data for creating a fixture that can simultaneously test the top surface of one printed circuit board and the bottom surface of a second printed circuit board. The present system eliminates the need to create expensive and labor intensive fixturing for the testing of dual sided printed circuit boards.

Whereas the present invention has been described with respect to specific embodiments thereof, it will be understood that various changes and modifications will be suggested to one skilled in the art and it is intended to encompass such changes and modifications as fall within the scope of the appended claims.

We claim:

1. A system for reducing the number of points to be tested on a printed circuit board, the printed circuit board having a top and a bottom surface, through holes, and a plurality of network traces extending across both surfaces of the printed circuit board and the network traces having end points, the system comprising:
   processor means for identifying the end points of a network trace extending on both surfaces of the printed circuit board;
   processor means for identifying a through hole along the network trace, the through hole being common to the network trace extending on both surfaces of the printed circuit board; and
   means for independently testing each surface of the printed circuit board between one end point and said through hole on the top surface of the printed circuit board and between said through hole and one end point on the bottom surface of the printed circuit board.

2. The system of claim 1 and further including:
   means for identifying the end point of a network trace on the same side of the printed circuit board.

3. A method for reducing the number of points to be tested on a printed circuit board, the printed circuit board having a top and a bottom surface, through holes, and a plurality of network traces extending across both surfaces of the printed circuit board and the network trace having end points, the system comprising:
   identifying the end point of a network trace extending on both surfaces of the printed circuit board;
   identifying a through hole along the network trace, the through hole being common to the network trace extending on both surfaces of the printed circuit board; and
   independently testing each surface of the printed circuit board between one end point and the through hole on the top surface of the printed circuit board and between the through hole and one end point on the bottom surface of the printed circuit board.

4. The method of claim 1 and further including:
   identifying the end point of a network trace on the same side of the printed circuit board.

* * * * *